United States Patent
Goo et al.

(10) Patent No.: US 6,489,252 B2
(45) Date of Patent: Dec. 3, 2002

(54) METHOD OF FORMING A SPIN-ON-GLASS INSULATION LAYER

(75) Inventors: Ju-Seon Goo, Suwon (KR); Eun-Kee Hong, Suwon (KR); Hong-Gun Kim, Suwon (KR); Jin-Gi Hong, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/978,650

(22) Filed: Oct. 16, 2001

(65) Prior Publication Data

US 2002/0119675 A1 Aug. 29, 2002

(30) Foreign Application Priority Data

Dec. 27, 2000 (KR) ........................................ 2000-82829

(51) Int. Cl.7 ............................................. H01L 21/469
(52) U.S. Cl. ..................... 438/758; 438/789; 438/790
(58) Field of Search ................................. 438/758, 789, 438/790, 787, 788; 427/226; 257/758

(56) References Cited

U.S. PATENT DOCUMENTS

| | | | | |
|---|---|---|---|---|
| 5,665,643 A | * | 9/1997 | Shin | ........................... 438/763 |
| 5,770,260 A | * | 6/1998 | Fukuyama et al. | .......... 427/226 |
| 5,976,618 A | * | 11/1999 | Fukuyama et al. | .......... 427/226 |
| 6,074,939 A | | 6/2000 | Wantanabe | .................. 438/596 |
| 6,086,699 A | * | 7/2000 | Nakashima et al. | ......... 156/230 |
| 6,258,649 B1 | * | 7/2001 | Nakamura et al. | ........... 438/238 |
| 6,294,833 B1 | * | 9/2001 | Usami | ......................... 257/758 |
| 2001/0028082 A1 | * | 10/2001 | Nakamura et al. | ........... 257/315 |

FOREIGN PATENT DOCUMENTS

JP   10242139   6/2000   ....... H01L/21/8247

* cited by examiner

Primary Examiner—John F. Niebling
Assistant Examiner—Olivia T Luk
(74) Attorney, Agent, or Firm—Mills & Onello LLP

(57) ABSTRACT

A method of forming a SOG insulation layer of a semiconductor device comprises the steps of forming the SOG insulation layer on a substrate having a stepped pattern using a solution containing a polysilazane in an amount of less than 20% by weight in terms concentration of solid content, performing a pre-bake process for removing solvent ingredients in the insulation layer at a temperature of 50 to 350° C., and annealing at a temperature of 600 to 1200° C. The method of the invention further includes performing a hard bake process at a temperature of about 400° C. between the pre-bake process and the annealing step. Also, the polysilazane is desirably contained in an amount of 10 to 15% by weight.

11 Claims, 4 Drawing Sheets

METHOD OF FORMING A SPIN-ON-GLASS INSULATION LAYER

This application relies for priority upon Korean Patent Application No.2000-82829, filed on Dec. 27, 2000, the contents of which are herein incorporated by reference in their entirety.

FIELD OF THE INVENTION

The present invention relates to a method of forming an insulation layer, and more particularly to a method of forming an insulation layer of a semiconductor device using a spin-on-glass (SOG) layer.

BACKGROUND OF THE INVENTION

As the elements incorporated into a semiconductor device are increasingly integrated, the sizes of the elements is gradually decreasing, and the semiconductor devices are becoming increasingly multi-layered. Thus, in highly integrated semiconductor devices, problems such as increase in the aspect ratio of contact or via holes which penetrate a given region between the interconnect lines or the circuit elements and enlargement of the step coverage are more intensified. That is, as the aspect ratio of the contact holes is increased, it becomes more difficult to form deep and narrow holes in certain layers of the device and to fill the narrow holes with conductive material to interconnect the multiple layers. Also, undesirable step coverage at a lower part of the device results in a problem when an upper part of the device is patterned to form the interconnects (wires) or elements by means of photolithography. To reduce these problems, a technique using an interlayer insulation layer such as a method of filling gaps between the elements such as gate lines with the interlayer insulation layer and planarizing the upper part of the interlayer insulation layer has been developed and used.

As an example of the technique using an interlayer insulation layer, there has been proposed a method of forming a boro-phospho silicate glass (BPSG) layer and then performing a heat treatment process at a high temperature of about 830° C. However, since width between gate lines is designed below a critical dimension (CD) of 0.2 $\mu$m with the semiconductor device highly integrated, the heat treatment at the high temperature for forming the interlayer insulation layer may result in a problem damaging the elements, for example reduced transistors in the semiconductor device.

To solve the problem due to the heat treatment at the high temperature, there has been another method of using an $O_3$ tetra ethyl ortho silicate undoped silicate glass ($O_3$ TEOS USG), or high density plasma enhanced chemical vapor deposition (HDP CVD) oxide layer. However, these layers also present a problem of generating voids or seams when the width between gate lines is designed below a CD of 0.2 $\mu$m, for example about 0.18 $\mu$m.

To solve the problems described above, there has been used another method of using a spin-on glass (SOG) layer as an interlayer insulation layer. SOG materials are advantageous to fill the gaps between the gate lines and to reduce the step coverage since it. is first in a state of liquid or sol.

As one of the SOG materials, hydro silsesquioxane (HSQ) material is used. After the HSQ material is applied to a substrate, a soft bake process is carried out at a low temperature of 100 to 300° C. to remove solvent ingredients. Then, a hard bake process is carried out at a temperature of about 400° C. for several, e.g., ten, minutes to harden the formed HSQ layer.

However, even though the HSQ layer is annealed under an oxidative atmosphere through the hard bake process, a curing of forming silicon dioxide-crystallized structures is not accomplished well. Particularly, in case of using the SOG layer to fill deep and narrow gaps of the pattern, it is difficult to make oxygen and elements combined thereto diffuse. Also, since the curing is carried out at relatively low temperature and begins from the surface of the SOG layer to interfere with the diffusion of oxygen, the HSQ layer is not cured very well.

When the curing of the HSQ layer is not accomplished well, impurity ingredients such as hydrogen and the like may not be removed completely and remain in the HSQ layer. The impurity ingredients may result in a problem such as forming a porous crystallized structure in the HSQ layer. When the following etching and cleaning process is carried out to a portion of the SOG layer having the porous crystallized structure, an etch rate at the portion of the SOG layer comes to be faster than that at other portions without the porous crystallized structure therein.

For example, in case the interlayer insulation layer is formed of the HSQ layer after forming a metal oxide silicon (MOS) transistor structure on a substrate, the porous structure is apt to be formed in a lower part of the interlayer insulation layer between the gate lines. Therefore, when the pads for bit line contacts or storage node contacts are formed by means of a self-aligned method, the lower part of the SOG layer having the porous structure is exposed. The exposed lower part of the SOG layer is easily etched by a very small amount of etchant contained in a detergent such as a mixture of $NH_4OH$, $H_2O_2$, and de-ionized water called SC1, or buffered oxide etcher (BOE). As a result, pipe line shaped bridges can be formed between the adjacent pads through the exposed lower part of the SOG layer. These bridges may cause a short circuit between wires such that the semiconductor device operates abnormally.

Also, in the portion of the SOG layer having the porous structure, a difference in the stress or tension is generated according to the thermal expansion and the like as compared with other portions without the porous structure, to deteriorate reliability of the elements and thereby cause generation of devices of inferior quality.

Among the SOG materials, silazane series is a material indicated as a structural formula —[$SiR_1R_2NR_3$]n— having an average atomic weight of 1000 to 2000. The silazane series usually uses perhydro-polysilazane wherein all of $R_1, R_2$, and $R_3$ is hydrogen, or organic polysilazane wherein $R_1, R_2$, and $R_3$ are alkyl radicals, an aryl radical, and an alkoxyl radical, respectively, containing 1–8 carbon atoms. The perhydro-polysilazane or organic polysilazane which is usually called polysilazane is used in a type of a solution in which it is melted as much as a given % by weight by a solvent such as dibuthyl ether, toluene, or xylene. The polysilazane can be treated by a process of higher temperature as compared with silicate or siloxane series, so that more complete curing can be accomplished. Also, the polysilazane has a high resistance to a wet etching, so that it is easy to apply to the real fabrication process compared with the HSQ layer. Also, when a polysilazane layer is formed to be relatively thick, a plane state of the whole surface of the substrate can be improved enough to carry out the subsequent process steps such as a chemical-mechanical polishing (CMP) without forming a capping oxide layer on an upper part of the polysilazane layer.

The polysilazane layer is generally baked by performing a bake process for removing solvent ingredients, and an annealing process for curing the baked polysilazane layer at a high temperature of more than 600° C., for example 700° C., after the polysilazane is applied to a substrate. An example of a method of baking and annealing the polysilazane layer is disclosed in Japanese Patent Applicant No. 97-044,132 filed by Nippon Denki Co., Ltd.

FIG. 1 is a flow chart showing the process steps of a conventional method of forming a SOG insulation layer of a semiconductor device. The method comprises forming a pattern on a surface of a substrate (10), applying a SOG layer on the surface of the substrate (20), performing a pre-bake process to the substrate (30), performing a high temperature annealing process to the substrate (40), and performing the subsequent process steps (50).

However, in the method, silane ($SiH_4$) gases which generally begin to discharge from the SOG layer in the vicinity of a temperature of about 400° C. are generated in a large quantity during the high temperature annealing process and easily combined with other discharged ingredients such as nitrogen and hydrogen, and an atmosphere gas such as oxygen. Consequently, a plurality of particles composed of silicon oxides or silicon nitrides having magnitudes of several hundred angstroms (Å) are formed on the surface of the substrate and/or in the inside of the equipment. These particles may result in particle defects of the corresponding substrate and/or other substrates in the equipment.

Also, if the particles, for example a particle 21 exists in the substrate before applying the polysilazane, the SOG layer 23 is thickened in the vicinity of the particle 21, as shown by an arrow in FIG. 2. After the high temperature annealing, the thickened portion of the SOG layer 23 is strengthened. Also, a difference in the stress is partially generated according to thermal expansion and the like, so that a crack 25 may be formed in the thickened portion of the SOG layer 23. If the particle or crack occurs in the manufacturing process, the production rate of the semiconductor device will not only be reduced, but also the reliability of the elements will be deteriorated.

SUMMARY OF THE INVENTION

Therefore, it is an object of the present invention to provide an improved method of forming an insulation layer of a semiconductor device which when a SOG layer of silazane series is used as the insulation layer, can restrain particles from forming on a surface of a substrate during a high temperature annealing.

It is another object of the present invention to provide an improved method of forming an insulation layer of a semiconductor device which when a SOG layer of silazane series is used as the insulation layer, can prevent cracks from forming due to particles which exists in a substrate before applying the SOG layer.

It is other object of the present invention to provide an improved method of forming an SOG insulation layer of a semiconductor device which can prevent side walls of contact holes from being damaged when a wet cleaning process is carried out after forming the contact holes in the SOG insulation layer.

These and other objects are provided, according to an aspect of the present invention, by a method of forming a SOG insulation layer of a semiconductor device. An SOG insulation layer is formed on a substrate having a stepped pattern using a solution containing polysilazane in an amount of less than 20% by weight in terms of concentration of solid content. A pre-bake process is performed at a temperature of 50 to 350° C. to remove solvent ingredients in the insulation layer. The resulting structure is annealed at a temperature of 600 to 1200° C.

In one embodiment, the pre-bake process comprises increasing a temperature continuously for 2 to 7 minutes. Alternatively, the pre-bake process can comprise heating at temperatures of 75° C., 150° C., and 250° C. for several minutes, preferably 1 to 2 minutes, each. The pre-bake process is carried out by means of an in-situ method.

In the embodiment, the annealing step is carried out at the temperature of 600 to 1200° C. for 10 to 120 minutes, preferably at 700 to 900° C. for 30 to 60 minutes. Generally, the more the annealing temperature and time are increased, the more curing is enhanced.

In one embodiment, the solution includes only a polysilazane polymer of a structural formula —$[SiR_1R_2NR_3]n$— as the solid content. When the solution includes an addition except the polymer and solvent ingredients, an atomic weight of the polymer can be changed to have influence on the viscosity, so that the thickness and flatness of the SOG layer formed by spin coating can be influenced. Accordingly, it is desirable that the solid content in the solution use only the polysilazane without the additional influence on the viscosity. Preferably, the polysilazane is contained in the solution in an amount of 5 to 15% by weight in terms of concentration of the solid content. When the amount of the polysilazane is below 5% by weight, it is difficult to adjust the thickness of the SOG layer. Particularly, in this case, since the SOG layer is apt to be shallowly formed, it is difficult to apply to the real process. The polysilazane desirably uses a perhydro-polysilazane indicated as a structural formula —$[SiH_2NH]n$—.

The method of the invention can further include forming a CVD insulation layer such as an oxide layer on the SOG layer by means of a CVD method such as a HDP CVD in order to obtain an interlayer insulation layer having a sufficient thickness. Also, the method of the invention can include planarizing the CVD insulation layer by means of a CMP. Thus, in the present invention, the interlayer insulation layer having required characteristics can be formed of the SOG layer and the CVD insulation layer. The SOG layer acts to fill gaps of the pattern and remove the step coverage due to the pattern, and the CVD insulation layer acts to obtain required thickness and reduce the step coverage.

Alternatively, the method of the invention can include performing a hard bake process at a temperature of 350 to 500° C. between the pre-bake process and the annealing step. The hard bake process is preferably carried out at a temperature of 400 to 450° C. for 30 to 60 minutes under an inert gas or vacuum atmosphere. In the inert gas or vacuum atmosphere, even though gases are generated from the SOG layer, a chemical reaction which forms particles is not activated, so that particles can be restrained from forming during the annealing process. Also, the hard bake process can be carried out under an oxidative atmosphere. In the oxidative atmosphere, since a concentration of the gases which generates during the hard bake process is low, formation of particles is minimal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
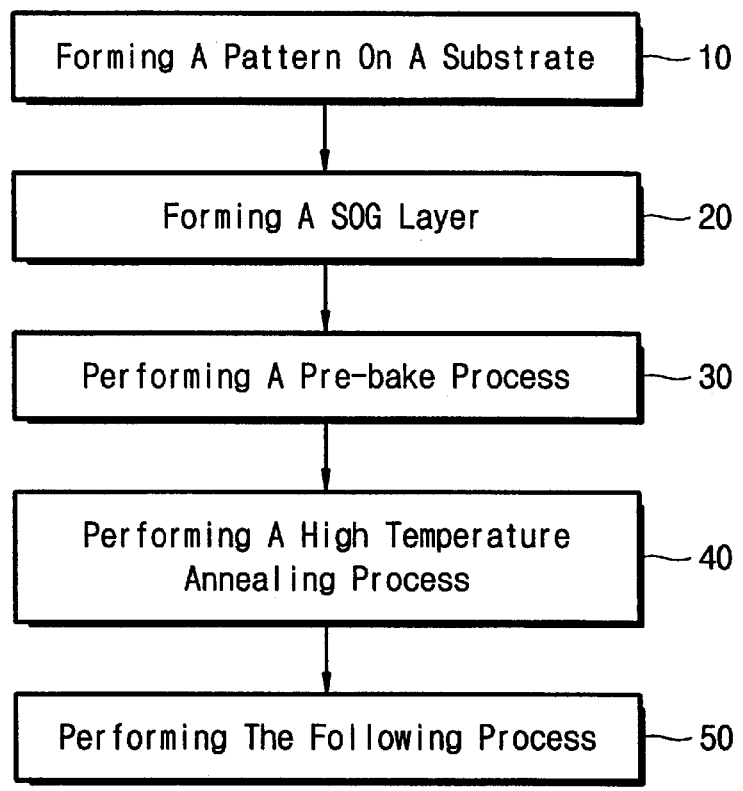
FIG. 1 is a flow chart of a conventional method of forming a SOG insulation layer of a semiconductor device.
Figure 2:
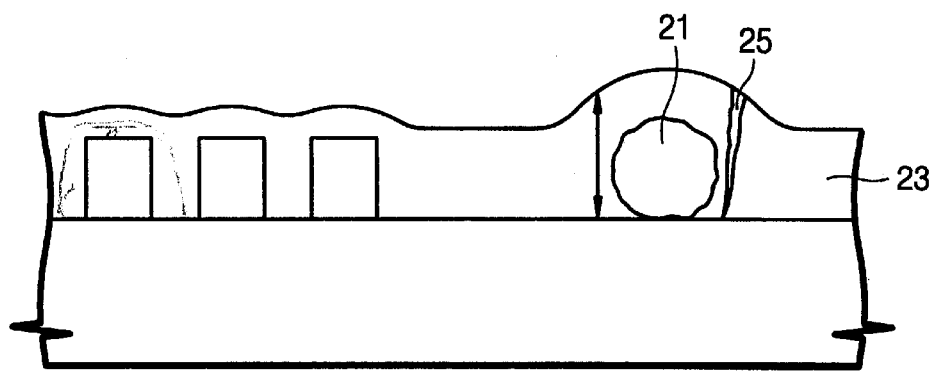
FIG. 2 is a cross-sectional view showing a problem of the conventional method of forming the SOG insulation layer of the semiconductor device.
Figure 3:
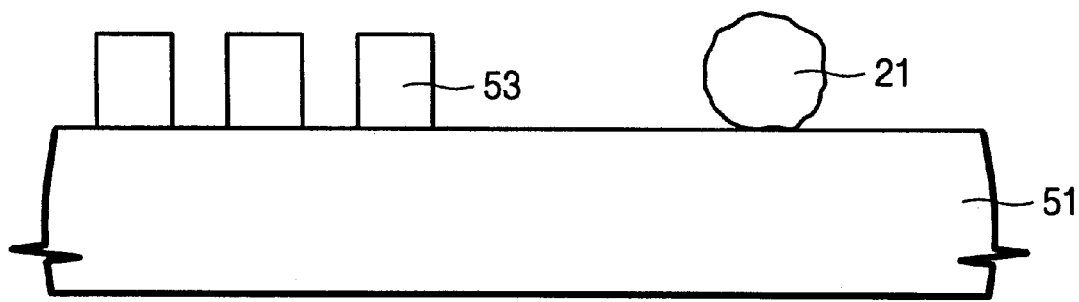
FIG. 3 to FIG. 6 are flow diagrams showing the process steps of a method of forming a SOG insulation layer of a semiconductor device in accordance with an embodiment of the present invention.

Referring to FIG. 3, first a conductive pattern 53 is formed on a flat surface of a substrate 51. Each of narrow and deep gaps or spaces formed in the conductive pattern 53 has an aspect ratio, i.e., the ratio of its depth to its width, of more than 5. In the gaps of the conductive pattern 53, trenches for isolation can be formed. Also, the conductive pattern 53 can form gate lines or bit lines for DRAM.

Figure 4:
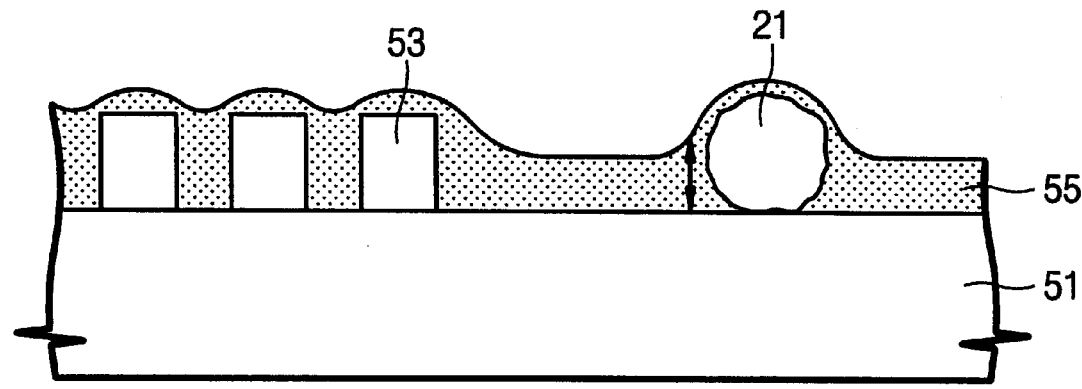

Referring to FIG. 4, a polysilazane, for example a perhydro-polysilazane is applied on the whole surface of the substrate 51 having the conductive pattern 53 so as to form a SOG insulation layer 55, by means of a spin-coating method. The SOG insulation layer 55 fills the gaps of the conductive pattern 53. The perhydro-polysilazane which is generally indicated as a structural formula —[SiH$_2$NH]n— is used as a solution melted as much as 12.8% by weight in a solvent such as dibuthyl ether or xylene. At this time, the rotation speed of the spinner for applying the polysilazane is adjusted to be the same as or slightly slower than that to a solution containing the polysilazane of 22% by weight. The polysilazane SOG layer 55 is shallowly formed to a thickness of several hundred angstroms Å on the conductive pattern 53, but the gaps of the conductive pattern 53 are almost filled. Before applying the polysilazane, a silicon oxide layer or a silicon nitride layer can be formed as a buffer layer by means of a HDP CVD, a plasma enhanced (PE) CVD, or a low pressure (LP) CVD suitable to fill gaps. The buffer layer can act to increase the adhesion between the SOG layer 55 and the substrate 51 on which the conductive pattern 53 is formed.

Then, a pre-bake process for removing solvent ingredients in the SOG layer 55 is carried out on the substrate 51 over which the SOG layer 55 is formed. In the pre-bake process, the substrate 51 is heated in a manner of increasing a heating temperature step by step in a same heating furnace or apparatus, i.e., in situ. For example, the substrate 51 is heated at temperatures of 75° C., 150° C., 250° C. for several minutes, for example 1 to 2 minutes, each. Through the pre-bake process, the solvent ingredients are almost removed. Of course, the heating temperature and time can be adjusted according to the conditions.

Next, a hard bake process which heats the substrate 51 at a temperature of 400 to 450° C. for 30 to 60 minutes is carried out. The hard bake process is performed under a vacuum or an inert gas such as nitrogen atmosphere. As a result, ingredients including silane gas, nitrogen, hydrogen, and the like are discharged in the form of gases from the SOG layer 55. However, in this step, since the processing temperature is lower than a general curing temperature of 600° C., an amount of discharged gases is small. Also, since a weight % of solid content is low to make the polysilazane SOG layer 55 to be shallowly formed, an absolute amount of discharged gases is small. Also, since a circumference atmosphere is the inert gas atmosphere, a chemical reaction which forms particles is not activated. Therefore, a large amount of gases are discharged, but most discharged gases are discharged outside without forming the particles.

Alternatively, the hard bake process can be carried out under an oxidative atmosphere which is abundant in oxygen or watery vapor. In the oxidative atmosphere, since a concentration of the gases generated during the hard bake process is low, formation of particles is minimal. Also, in the oxidative atmosphere, a cured film or layer can be formed to prevent gases from generating from the SOG layer. Also, the hard bake process cannot be carried out according to the conditions.

Figure 5:
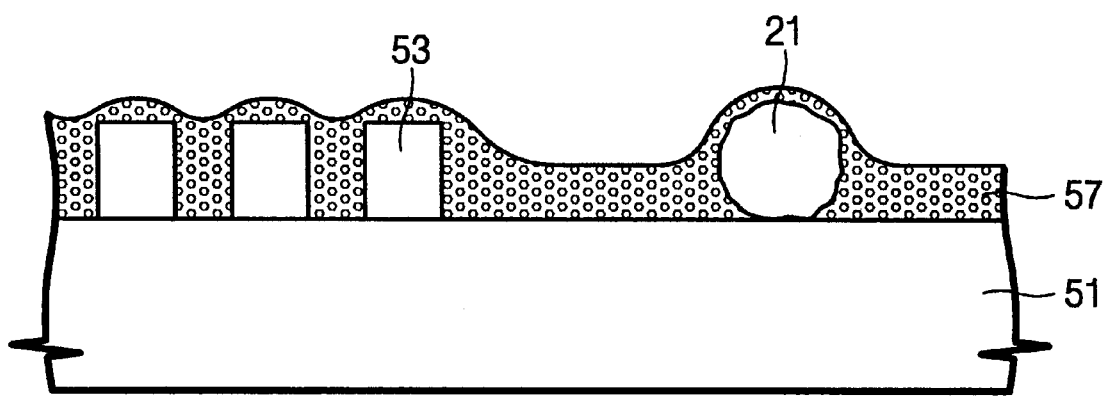

Referring to FIG. 5, after performing the hard bake process, the substrate is annealed at a temperature of 700 to 900° C. As a result, the properties of the SOG layer 57 are changed. The annealing which acts mainly to cure the substrate is carried out under an oxidative atmosphere for 10 minutes. Alternatively, to increase the curing effect, the annealing can be carried out for 30 to 60 minutes. Since the absolute amount of discharged gases is small due to the shallow thickness of the SOG layer 57 and the discharged ingredients are already removed in a large quantity through the hard bake process, the concentration of discharged gases is lowered and particles generated as the result of reaction between the discharged gases and the supplying gases is also reduced, as compared with annealing a layer having the polysilazane solid content of a high % by weight at a high temperature.

Also, although the particles, for example a particle 21, may exists in the substrate 51 before forming the SOG layer 55, the SOG layer 57 is almost not thickened in the vicinity of the particle 21 since the weight % of solid content in the polysilazane solution forming the SOG layer is low and the SOG layer 57 is shallow. Accordingly, the cracks are restrained from forming due to the difference in the tension partially which occurs according to thermal expansion and the like in a portion of the SOG layer 57 during the high temperature annealing.

Figure 6:
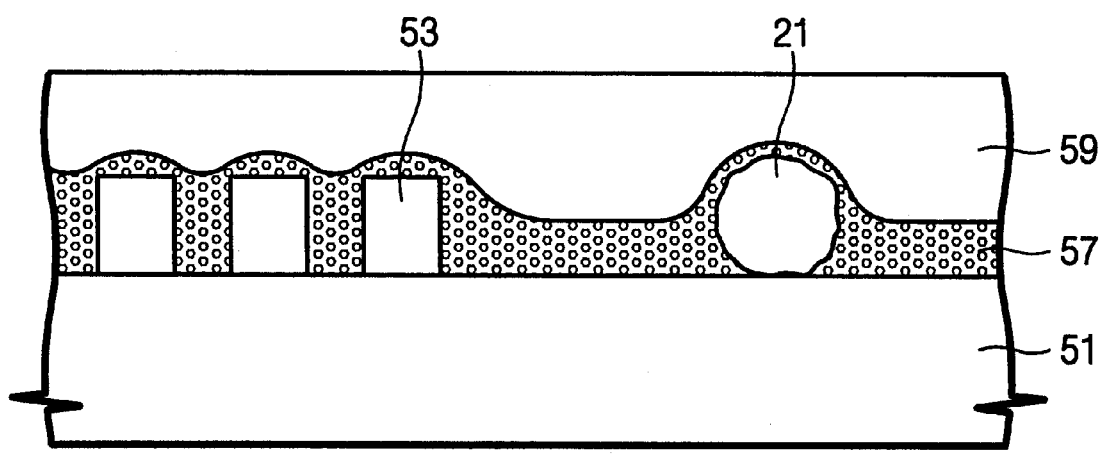

Referring to FIG. 6, when the conductive pattern 53 formed on the substrate 51 forms the gate lines or the bit lines, the following process of forming an CVD insulation layer 59 such as a silicon oxide layer, a silicon nitride layer or a silicon nitride-oxide layer for supplementing the SOG layer 57 can be carried out by means of a method such as HDP CVD. After forming the CVD insulation layer 59, a planarization process can be carried out to reduce the step coverage of cell and peripheral regions. At this time, since the SOG layer 57 is covered with the CVD insulation layer 59, the planarization process can be controlled. Also, when the following wet cleaning process is carried out after forming contact holes in the SOG and CVD insulation layers, damage to the side walls of contact holes in the SOG layer can be reduced since the wet etch rate of the SOG layer is low.

Figure 7:
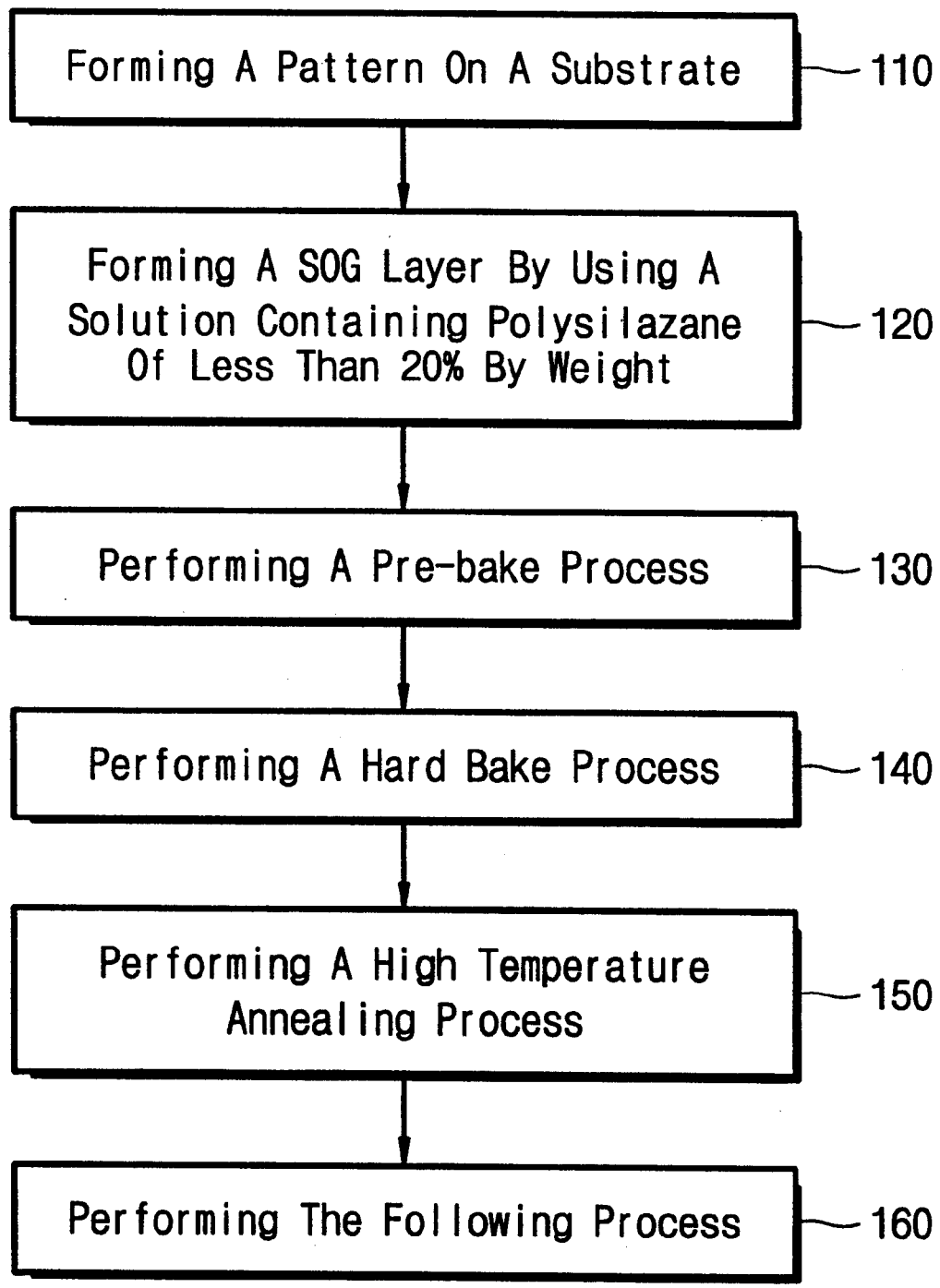
FIG. 7 is a flow chart of the method of forming the SOG insulation layer of the semiconductor device in accordance with the present invention.

FIG. 7 shows a flow chart of the process steps of the method of forming the SOG insulation layer of the invention. As described above, the method of the invention comprises forming the pattern on the substrate (110), forming the SOG layer by using the solution containing the polysilazane in the amount of less than 20% by weight in terms of concentration of the solid content (120), performing the pre-bake process (130), performing the hard bake process (140), performing the high temperature annealing process (150), and performing the subsequent or following process (160).

The effect of the method of forming the SOG insulation layer in accordance with the present invention will now be described with reference to the following tables.

Referring to table 1, particle generating frequencies for wafers fabricated according to the conventional method and a preferred embodiment of the invention are illustrated. In the conventional method, a solution containing a polysilazane in an amount of 22 to 23% by weight in terms concentration of solid content was used and pre-bake and annealing processes were carried out, whereas in the invention, a solution containing polysilazane in an amount of 12.8% by weight was used and pre-bake and annealing processes were carried out. However, in both the conventional method and the invention, patterns were not formed for facilitating the observation.

Table 2 shows the number of wafers in which cracks are generated, among observed wafers.

TABLE 1

| Slot No. | The conventional method | The present invention |
|---|---|---|
| 1 | Fail | 2 |
| 2 | Fail | 16 |
| 3 | Fail | 5 |
| 4 | Fail | 4 |
| 5 | Fail | 4 |
| 6 | 406 | 2 |
| 7 | 5225 | 5 |
| 8 | 115 | 4 |
| 9 | 64 | 5 |
| 10 | 44 | 8 |
| 11 | 93 | 2 |
| 12 | 164 | 4 |
| 13 | 143 | 1 |
| 14 | 555 | 4 |
| 15 | 1205 | 3 |

Fail: in case particles are too numerous to count.

TABLE 2

|  | The number of observed wafers | The number of wafers in which cracks are generated |
|---|---|---|
| The conventional method | 14 | 5 |
| The present invention | 12 | 1 |

As can be appreciated from the above tables, the present invention can evidently reduce the particle and crack generating frequencies as compared with the conventional method using the solution containing the polysilazane in the amount of 22 to 23% by weight in terms concentration of the solid content.

As apparent from the foregoing description, it can be appreciated that when the SOG layer is formed as the insulation layer on the substrate having the dense pattern, the present invention can restrain the particles from forming due to the gases generated from the SOG layer, and prevent the cracks from generating after the high temperature annealing due to the particles which exists in the substrate before forming the SOG layer, thereby reducing devices of inferior quality and increasing reliability and stability of the devices.

In the drawings and specification, there has been disclosed a typical preferred embodiment of the invention and, although specific terms are employed, they are used in a generic and descriptive sense only and not for purpose of limitation, the scope of the invention being set forth in the following claims.

What is claimed is:

1. A method of forming a SOG insulation layer of a semiconductor device comprising the steps of:

forming a SOG insulation layer on a substrate having a stepped pattern using a solution containing a polysilazane in an amount of less than 20% by weight in terms concentration of solid content;

performing a pre-bake process for removing solvent ingredients in said insulation layer at a temperature of 50 to 350° C., wherein said pre-bake process step comprises heating by means of an in-situ method; and annealing the resultant substrate at a temperature of 600 to 1200° C.

2. The method according to claim 1, wherein said pre-bake process step comprises increasing a temperature continuously for 2 to 7 minutes.

3. The method according to claim 1, further including the step of performing a hard bake process at a temperature of 350 to 500° C. between said pre-bake process step and said annealing step.

4. The method according to claim 3, wherein said hard bake process step is carried out under one of an inert gas and a vacuum atmosphere.

5. The method according to claim 1, wherein said annealing step is carried out at a temperature of 700 to 900° C. for 30 to 60 minutes.

6. The method according to claim 1, wherein said solution includes only a polysilazane polymer having a structural formula —[$SiR_1R_2NR_3$]n— as said solid content.

7. The method according to claim 1, wherein said polysilazane is contained in said solution in an amount of 5 to 15% by weight in terms concentration of said solid content.

8. The method according to claim 7, wherein said solution includes only a polysilazane polymer having a structural formula —[$SiR_1R_2NR_3$]n— as said solid content.

9. The method according to claim 1, further including the step of forming a CVD insulation layer after said annealing step.

10. The method according to claim 9, to wherein said CVD insulation layer forming step includes forming a silicon oxide layer by means of a HDP CVD.

11. The method according to claim 9, further including the step of performing a planarization process after said CVD insulation layer forming step.

* * * * *